(12) United States Patent
Ito (10) Patent No.: US 6,473,570 B2
(45) Date of Patent: Oct. 29, 2002

(54) CAMERA HAVING FLEXIBLE CIRCUIT BOARD

(75) Inventor: Toru Ito, Saitama (JP)

(73) Assignee: Fuji Photo Optical Co., Ltd., Saitama (JP)

(*) Notice: Subject to any disclaimer, the term of this patent is extended or adjusted under 35 U.S.C. 154(b) by 27 days.

(21) Appl. No.: 09/820,780

(22) Filed: Mar. 30, 2001

(65) Prior Publication Data

US 2001/0026686 A1 Oct. 4, 2001

(30) Foreign Application Priority Data

Mar. 31, 2000 (JP) ........................................ 2000-099364

(51) Int. Cl.[7] .............................................. G03B 17/00
(52) U.S. Cl. ........................ 396/542; 396/440; 361/749
(58) Field of Search ............................... 396/440, 542, 396/535, 536, 538, 541; 361/749

(56) References Cited

U.S. PATENT DOCUMENTS

| | | | |
|---|---|---|---|
| 5,155,511 A | 10/1992 | Tamamura | |
| 5,181,065 A | 1/1993 | Hara | |
| 5,502,526 A | 3/1996 | Katano | |
| 5,517,266 A | 5/1996 | Funaki et al. | |
| 5,784,660 A | 7/1998 | Tanaka | |
| 6,160,967 A | * 12/2000 | Mizobuchi | ............ 361/818 |
| 6,327,442 B1 | * 12/2001 | Ichikawa | ............ 361/749 |
| 6,356,717 B2 | * 3/2002 | Tanaka et al. | ............ 396/542 |

* cited by examiner

Primary Examiner—David M. Gray
Assistant Examiner—Michelle Nguyen
(74) Attorney, Agent, or Firm—Young & Thompson (57) ABSTRACT

A camera has a camera body for being loaded with photo film. A feeder mechanism is incorporated in the camera body, includes a feeder motor and a take-up spool, for feeding the photo film. A motor driver IC drives the feeder motor. A CPU controls the feeder motor by use of the motor driver IC. A main flexible circuit board has an upper board portion and a rear board portion. The upper board portion is located on an upper side of the camera body, and provided with the motor driver IC disposed thereon. The rear board portion extends from the upper board portion, is located behind the camera body, and is provided with CPU disposed thereon.

25 Claims, 6 Drawing Sheets

CAMERA HAVING FLEXIBLE CIRCUIT BOARD

BACKGROUND OF THE INVENTION

1. Field of the Invention

The present invention relates to a camera having a flexible circuit board. More particularly, the present invention relates to a camera having a flexible circuit board in which connection to circuit elements is improved in consideration of reducing a manufacturing cost.

2. Description Related to the Prior Art

A camera is provided with an auto-focus mechanism, a power zoom mechanism, an auto-winding mechanism and the like. To control various mechanisms, plural electronic circuits are incorporated in the camera. A type of the camera for use with a IX 240 type of a photo film cassette is provided with a reader for reading data from a data disk of the photo film cassette, a magnetic head for reading data from, and writing data to, a magnetic recording layer of the photo film, and the like. At least one flexible circuit board is incorporated in the camera, adapted to mounting of various electronic parts to constitute a control circuits of various types. The flexible circuit board is flexed and inserted in small spaces defined in the camera.

U.S. Pat. No. 5,784,660 (corresponding to JP-A 8-122906) discloses the camera for use with the photo film cassette of the IX 240 type. A cassette holder chamber of the camera is loaded with the photo film cassette upon movement of the photo film cassette in its axial direction through a lower or upper face of the camera. The camera does not have a back lid provided in the camera of a type for use with 135 type of the photo film cassette. Thus, a pressure plate is secured to the camera body behind an exposure aperture for supporting a back surface of the photo film. The pressure plate is provided with various electric parts, circuits, the flexible circuit board, a liquid crystal display panel and the like.

The camera of a known type includes the flexible circuit board for a main use and a plurality of flexible circuit boards for auto-focus, shutter and the like. Those are connected to one another inside the camera. This has a problem in cause a rise in the cost. Also, failure is likely to occur in electrical contact between the flexible circuit boards. There is no known suggestion of optimizing disposition of electronic parts on the flexible circuit boards. This is inconsistent to an idea of reducing a size of the camera, because sizes of the flexible circuit boards are not reduced.

In a manufacturing line for the camera, a focal length of the lens, performance of a shutter and the like are inspected. To this end, inspecting beam is introduced through the lens, and received and evaluated in the position of the exposure aperture. If the camera is for use with the IX 240 type of the photo film cassette, the pressure plate must be removed from the rear of the camera body before the camera can be inspected. However, there is no known technique of keeping the main flexible circuit board movable together with the pressure plate. It is impossible to prevent disconnection of the flexible circuit boards, or to prevent removal between a plurality of the flexible circuit boards.

SUMMARY OF THE INVENTION

In view of the foregoing problems, an object of the present invention is to provide a camera having a flexible circuit board in which connection to circuit elements is improved in consideration of reducing a manufacturing cost by optimizing disposition of the circuit elements.

In order to achieve the above and other objects and advantages of this invention, a camera includes a camera body for being loaded with photo film. A feeder mechanism is incorporated in the camera body, includes a feeder motor, for feeding the photo film. A motor driver IC drives the feeder motor. A control unit controls the feeder motor by use of the motor driver IC. A main flexible circuit board has an upper board portion and a rear board portion, the upper board portion being located on an upper side of the camera body, and provided with the motor driver IC disposed thereon, the rear board portion extending from the upper board portion, being located behind the camera body, and being provided with the control unit disposed thereon.

The upper board portion projects from a portion of an upper edge of the rear board portion.

Furthermore, a pressure plate is disposed behind the camera body, has a front surface and a rear surface, the front surface supporting the photo film, the rear surface having the rear board portion secured thereto.

The photo film includes a magnetic recording layer. Furthermore, a magnetic head is secured to the pressure plate, connected with the rear board portion, controlled by the control unit, for magnetic recording of information to the magnetic recording layer.

Furthermore, an operation member is disposed outside the camera body. At least one contact point is turned on/off by the operation member, to input a signal to the control unit, the contact point being provided in the rear board portion. A display panel is connected with the rear board portion, for visibly indicating information outside the camera body.

Furthermore, a battery chamber is formed in an upper portion of the camera body, for being loaded with a power source battery for supplying the main flexible circuit board with power.

The camera body includes a cassette holder chamber for being loaded with a photo film cassette having the photo film. A take-up chamber takes up the photo film from the photo film cassette in a roll form. An exposure aperture is formed between the cassette holder chamber and the take-up chamber and in front of the pressure plate, for creating a frame in the photo film. The upper board portion is disposed on an upper side of the cassette holder chamber.

Furthermore, an auxiliary circuit board is secured to a front side of the camera body. The main flexible circuit board further includes a front board portion extended from the upper board portion toward the front side of the camera body, and connected with the auxiliary circuit board.

The auxiliary circuit board is a shutter control flexible circuit board for shutter releasing.

Furthermore, a cassette detecting flexible circuit board is disposed behind the camera body, connected with the main flexible circuit board, for detecting operation of a photo film cassette having the photo film. A flash control printed circuit board is disposed on the front side of the camera body, for flash emitting operation. A flash connection flexible circuit board is disposed on the upper side of the camera body, for connecting the flash control printed circuit board with the main flexible circuit board. An auto-focus control flexible circuit board is disposed on the upper side of the camera body, connected with the main flexible circuit board, for rangefinding operation.

According to another aspect of the invention, a camera includes a camera body for being loaded with photo film. An exposure aperture is formed in the camera body, for creating a frame in the photo film. A pressure plate is disposed behind the exposure aperture, has a front surface and a rear surface, the front surface supporting the photo film. A main flexible circuit board is secured to the rear surface of the pressure plate. An auxiliary circuit board is secured to the camera body. A belt-shaped connector connects the auxiliary circuit board to the main flexible circuit board, the belt-shaped connector having a length higher than an interval between the auxiliary circuit board and the main flexible circuit board, for keeping the auxiliary circuit board connected to the main flexible circuit board with looseness when the pressure plate is removed from the camera body.

The belt-shaped connector has a folded shape or has a shape being bent back.

The belt-shaped connector is disposed at least partially under the camera body.

Furthermore, a taking lens introduces object light to the photo film. A zoom mechanism includes a zoom driving motor, for zooming the taking lens. A zoom sensor is connected with the auxiliary circuit board, for detecting a rotational position of the zoom driving motor.

Furthermore, a feeder mechanism is incorporated in the camera body, includes a feeder motor, for feeding the photo film. A feeder sensor is connected with the auxiliary circuit board, for detecting a rotational position of the feeder motor.

The belt-shaped connector is an extension extending from the auxiliary circuit board.

In a preferred embodiment, the belt-shaped connector is previously separate from the main flexible circuit board and the auxiliary circuit board.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
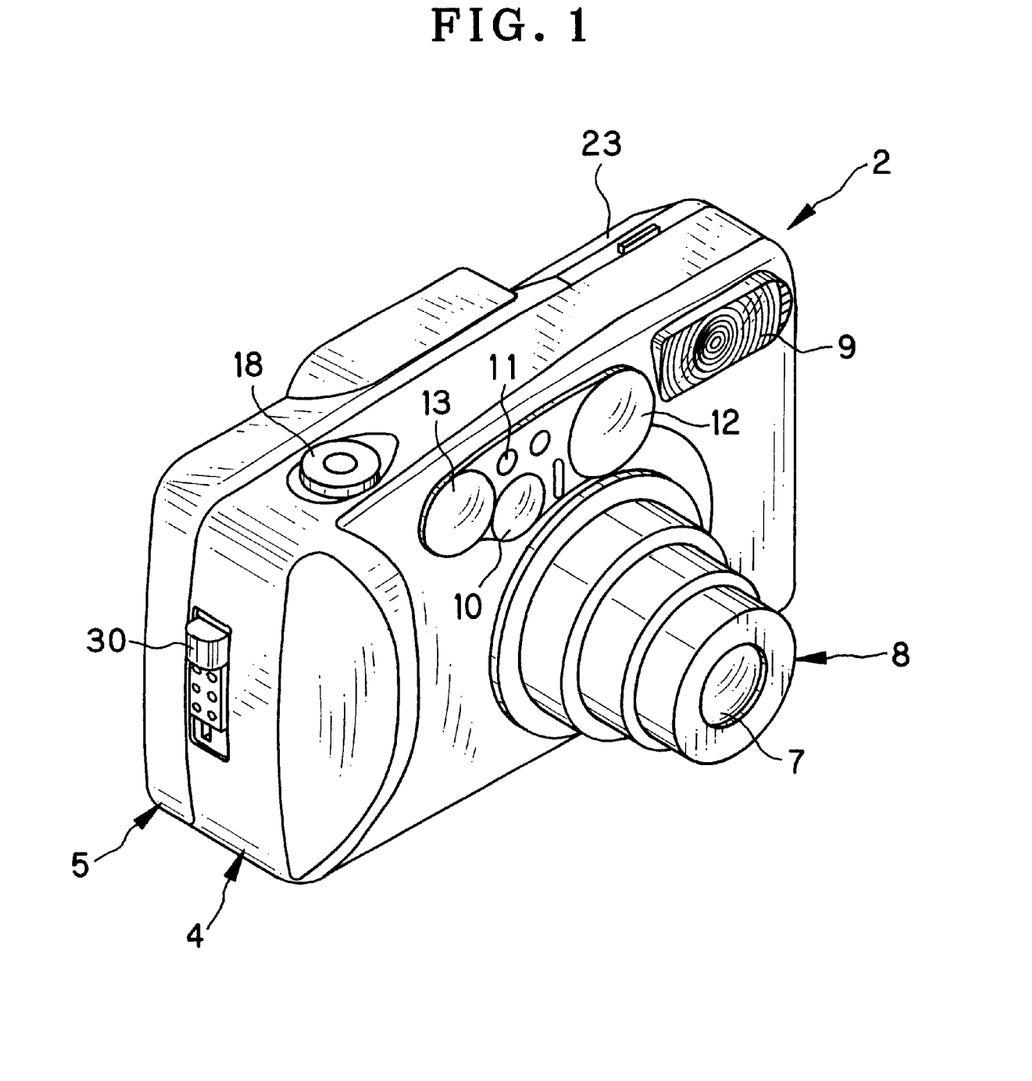
FIG. 1 is a front perspective illustrating a camera.
Figure 2:
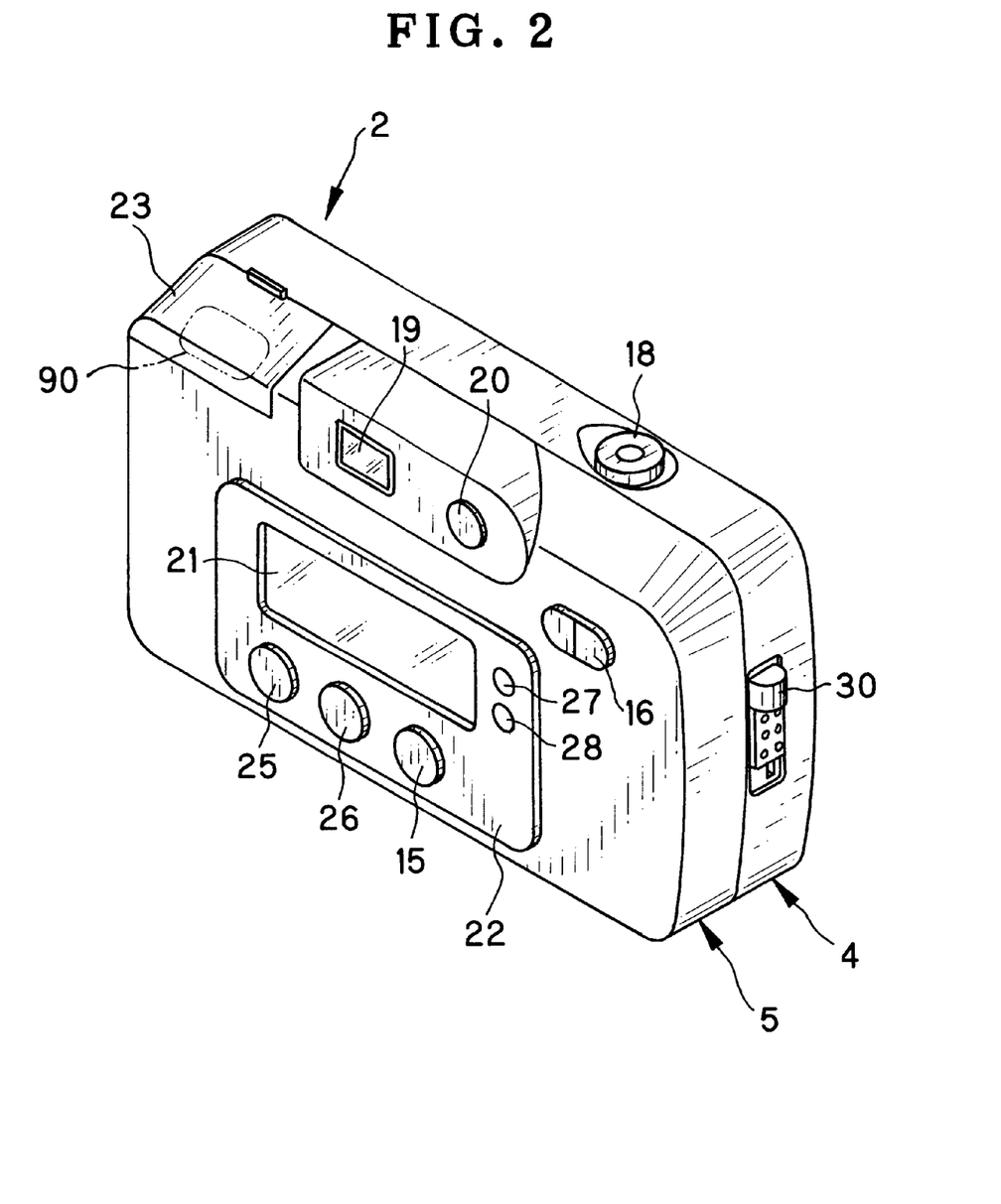
FIG. 2 is a rear perspective illustrating the camera.
Figure 3:
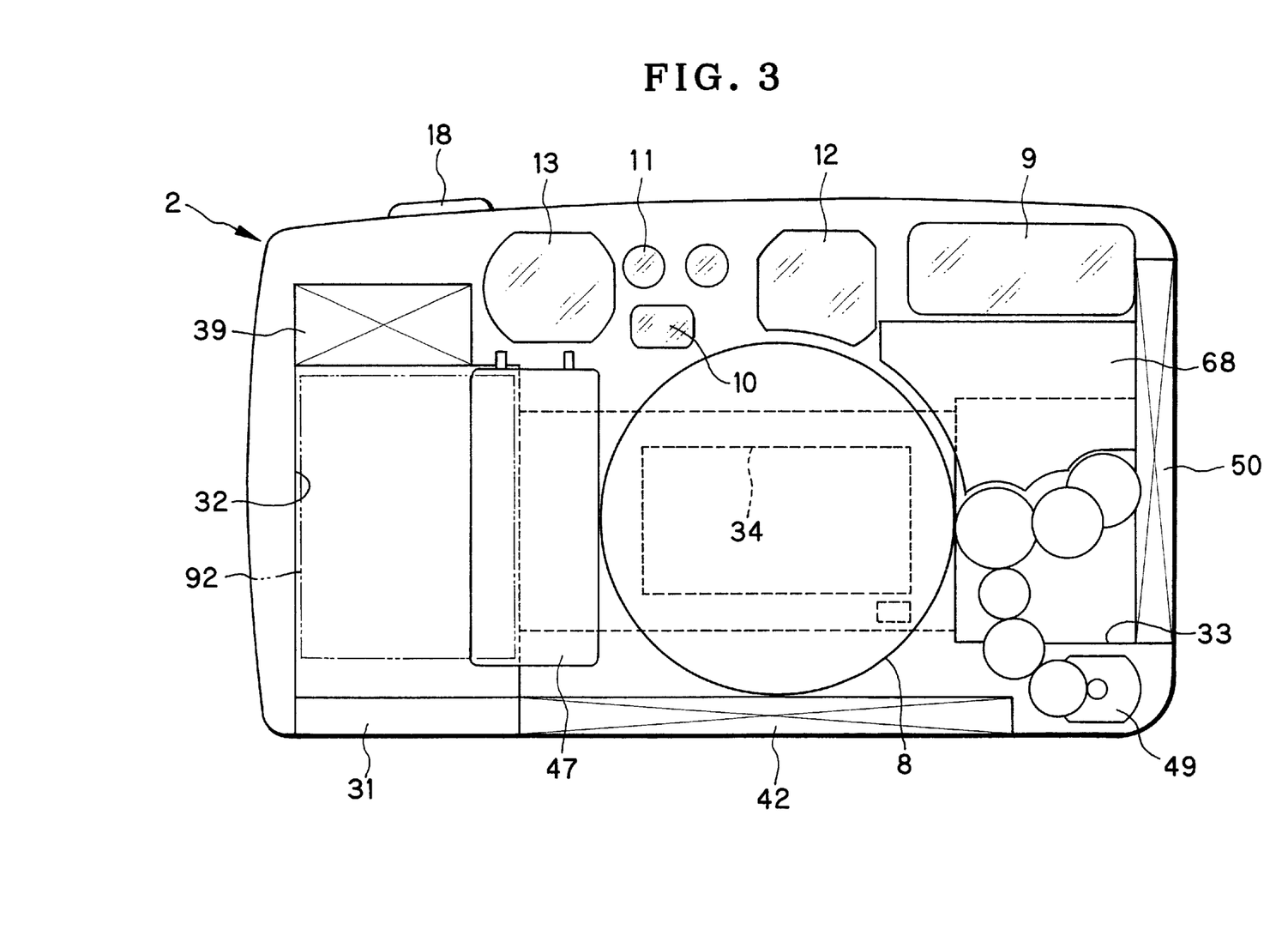
FIG. 3 is an explanatory view in elevation, illustrating arrangement of various elements in the camera.

In FIGS. 1 and 2, a camera 2 of the invention is illustrated. In FIG. 3, elements in the camera 2 are depicted in a suitably determined arrangement. The camera 2 includes a camera body 3, a front cover 4 and a rear cover 5. See FIG. 4. The camera body 3 includes the various elements. The front cover 4 and the rear cover 5 cover front and rear sides of the camera body 3.

A movable barrel 8 in a zoom mechanism is disposed in a center of the camera 2 and appears in the front. A taking lens 7 is supported in the movable barrel 8. A flash emitter 9 is disposed in a right corner portion of the camera 2. There are windows in an upper portion of the camera 2, which includes a viewfinder objective window 10, a photometric window 11, a rangefinding projecting window 12 and a rangefinding receiving window 13. The movable barrel 8 includes the taking lens 7 and an electronic shutter. The taking lens 7 is a zoom optical system or zoom lens. When a power button 15 in the rear of the camera 2 is turned on, the movable barrel 8 is moved forwards in the camera 2. When the power button 15 is turned off, the movable barrel 8 is collapsed in the camera 2. A zoom button 16 is operated manually. According to operation of the zoom button 16, a projecting amount changes to change a focal length. The flash emitter 9 constitutes an element of a zoom flash device, in which according to zooming operation to the zoom button 16, the flash emitter 9 moves together with the movable barrel 8 in the camera 2 in parallel with the optical axis, to change an illuminating range for a photographic field.

A shutter release button 18 is disposed in an upper side of the camera 2. In the rear of the camera 2, there are a viewfinder eyepiece window 19, a frame size changer button 20, a display panel 21 and an operation panel 22 in addition to the zoom button 16. The frame size changer button 20 is operable for selectively setting a frame size being standard, wide-vision or panoramic. The display panel 21 indicates various kinds of information. Behind the flash emitter 9, a battery chamber 23 is formed for containing a battery 90 as power source of the camera 2. A chamber lid of the battery chamber 23 is closed to cover the battery 90.

The operation panel 22 as input unit has not only the power button 15 but a mode selector button 25, a self timer button 26, a date imprinting button 27 and an MRC button 28. The mode selector button 25 changes over modes of the camera for taking exposures. The self timer button 26 is used for self photography. The date imprinting button 27 is used for inputting a date, time or the like to be imprinted into a frame. The MRC button 28 is operated at the time of unloading and reloading a photo film cassette in the course of partial use of the photo film.

A lid opener button 30 is disposed on a lateral face of the camera 2, and slidable vertically. A cassette holder chamber 32 has a lower opening, which a lower lid 31 closes in the bottom of the camera 2. The lid opener button 30 is slid to open the lower lid 31. The cassette holder chamber 32 is loaded with a photo film cassette 92. See FIG. 3. Note that, while the photo film cassette 92 before taking exposures to all the frames exists in the cassette holder chamber 32, the lid opener button 30 is locked and not operable. The lower lid 31 is kept closed.

Figure 4:
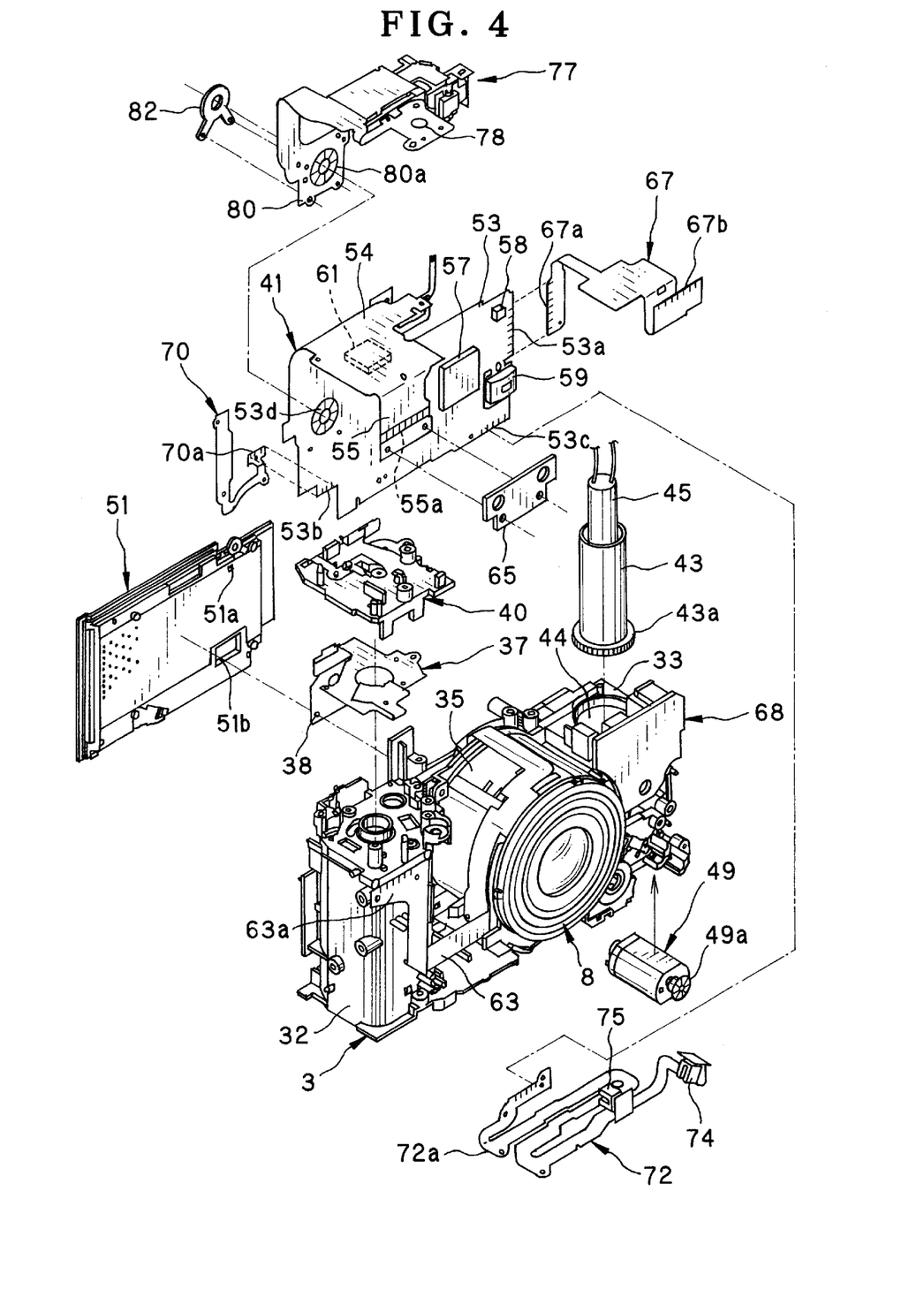
FIG. 4 is an exploded perspective illustrating a camera body, a main flexible circuit board, and other elements of the camera.
Figure 5A:
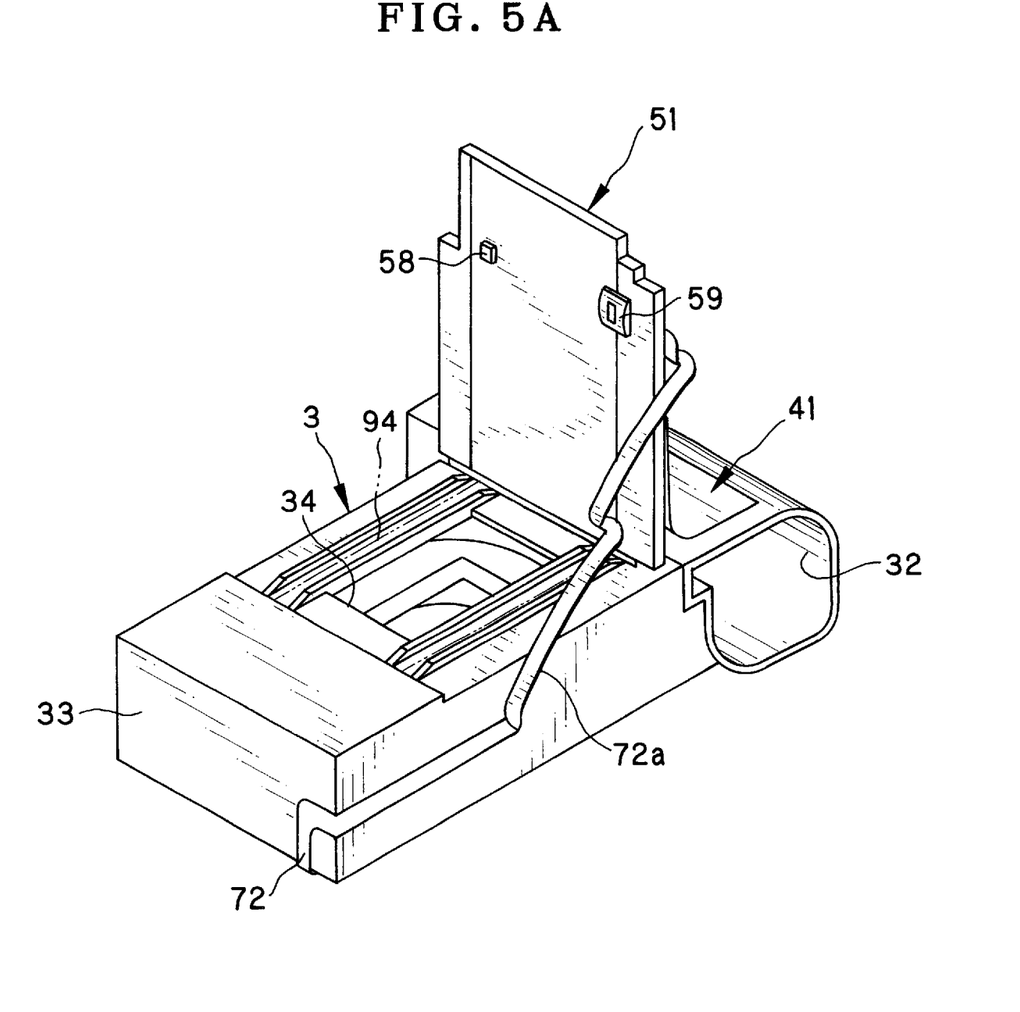
FIG. 5A is a perspective illustrating the camera body in which a pressure plate is about to be removed.

In FIG. 4, the cassette holder chamber 32 is loaded with the photo film cassette 92 of the IX 240 type. Also, a take-to up chamber 33 is formed in the camera body 3. A photo film 94 is unwound from the photo film cassette 92, and taken up in the take-up chamber 33. In FIG. 5A, the camera body 3 is viewed from the rear. An exposure aperture 34 is formed in the camera body 3 and disposed between the cassette holder chamber 32 and the take-up chamber 33 for defining an exposure region in the photo film 94. Also, a stationary barrel 35 is incorporated in the camera body 3, disposed in front of the exposure aperture 34, for containing the movable barrel 8.

In a space at the top of the cassette holder chamber 32, there are an information reading flexible circuit board 37, a drive shaft and a cassette opener mechanism 39. The drive shaft becomes engaged with a spool of the photo film cassette 92. The cassette opener mechanism 39 rotates a cassette shutter for opening and closing a photo film passageway of the photo film cassette 92. The information reading flexible circuit board 37 is provided with a sensor, which reads data from the photo film cassette 92, the data representing photosensitivity and the number of available frames of the photo film 94, and the state of being unexposed, partially exposed and all exposed of the photo film 94. Also, a connection board portion 38 extends from the information reading flexible circuit board 37, has a quadrilateral shape, and is disposed behind the cassette holder chamber 32. One surface of the connection board portion 38 has a terminal, which is in a disk shape, and includes segments extending radially and having conductivity. The terminal operates for connection of the information reading flexible circuit board 37 to a main flexible circuit board and an auto-focus control flexible circuit board.

A support plate 40 is secured to an upper wall of the cassette holder chamber 32. The support plate 40 supports the drive shaft, the cassette opener mechanism 39 and the like. Also, a main flexible circuit board 41 is partially secured to an upper face of the support plate 40.

A hole 44 is formed in an upper wall of the take-up chamber 33. A take-up spool 43 in a feeder mechanism is inserted in the hole 44. The take-up spool 43 has a cylindrical shape with hollowness, is supported by a lower wall of the take-up chamber 33, and is kept rotatable in the take-up chamber 33. A feeder motor 45 is contained in the take-up spool 43 as a power source in the feeder mechanism for feeding the photo film 94.

A speed reduction gear train 42 is incorporated in a lower portion of the camera body 3 for transmitting rotation of the feeder motor 45. A gear 43a is included in a lower portion of the take-up spool 43, and is caused to rotate by the speed reduction gear train 42, so as to rotate the take-up spool 43. Also, a transmission shaft (not shown) is disposed in a lateral position of the cassette holder chamber 32, and transmits the rotation of the speed reduction gear train 42 to each of various mechanisms disposed above the cassette holder chamber 32. There is a main capacitor 47 disposed between the cassette holder chamber 32 and the stationary barrel 35 for storing charge to be used in emitting flash.

A zoom driving motor 49 is disposed in a space under the take-up chamber 33, and operates in the zoom mechanism to move the movable barrel 8 for the purposes of zooming, focusing and collapsing. In FIG. 3, there is a difference in sizes of the take-up chamber 33 and the cassette holder chamber 32 in a vertical direction. The zoom driving motor 49 is disposed in a space associated with the difference in the sizes. This is effective in reducing the size of the camera 2 in the vertical direction.

A flash sliding mechanism 50 is driven by rotation of the zoom driving motor 49. The flash sliding mechanism 50 is disposed in a lateral position of the take-up chamber 33. The flash sliding mechanism 50 moves the flash emitter 9 in parallel with an optical axis in the camera 2, to change an illuminating angular range of flash light.

A pressure plate 51 is secured to the rear of the camera body 3 in a manner to close the exposure aperture 34. The pressure plate 51 supports a back surface of the photo film 94 for flatness between the take-up chamber 33 and the cassette holder chamber 32. A sensor opening 51a is formed in a corner portion of the pressure plate 51, and adapted to disposition of a photoelectric sensor for detecting perforations of the photo film 94. Also, a head opening 51b is formed in the pressure plate 51, and adapted to disposition of a magnetic head for magnetic reading and recording of data.

Figure 5B:
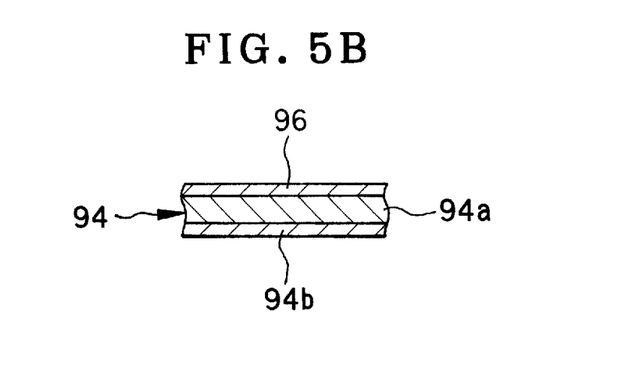
FIG. 5B is a cross section illustrating layers of photo film.

In FIG. 5B, the photo film 94 is constituted by a support 94a, a photosensitive emulsion layer 94b and a magnetic recording layer 96. The magnetic recording layer 96 operates for magnetic reading and recording in a suitable manner by means of the magnetic head.

Figure 6:
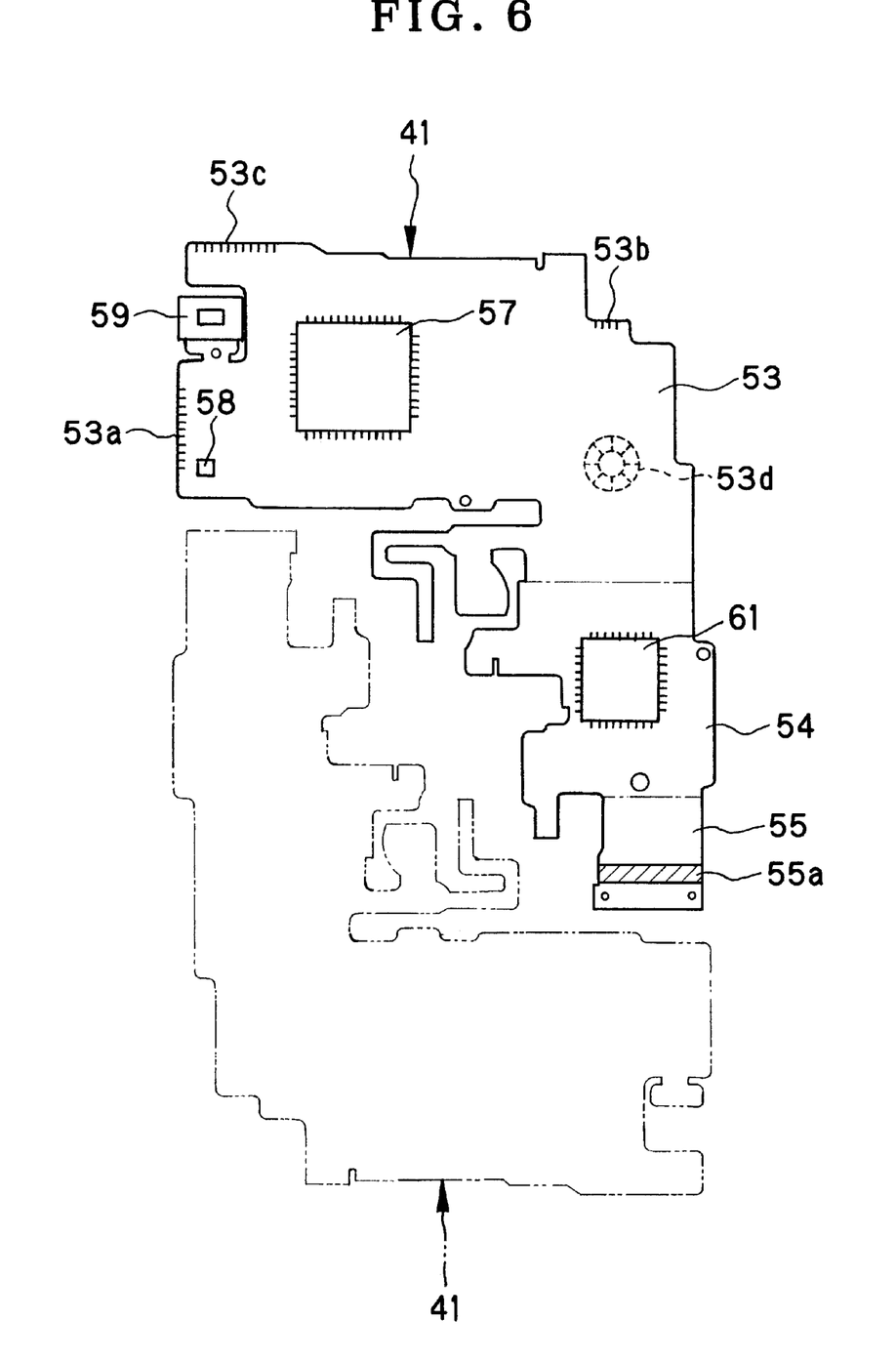
FIG. 6 is an explanatory view in plan, illustrating two main flexible circuit boards in combination in the course of a manufacturing step.

The main flexible circuit board 41 is secured to the camera body 3, and includes plural electronic parts to constitute various circuits. In FIG. 6, the main flexible circuit board 41 is depicted in a developed shape which is approximately an L shape. The main flexible circuit board 41 includes a rear board portion 53, an upper board portion 54 and a front board portion 55. The rear board portion 53 is combined with the pressure plate 51, and has a quadrilateral shape. The upper board portion 54 projects from a portion of an upper edge of the rear board portion 53. Also, the front board portion 55 projects from a front edge of the upper board portion 54.

The rear board portion 53 of the main flexible circuit board 41 is extended to the rear of the camera body 3 and secured to the rear surface of the pressure plate 51. A front surface of the rear board portion 53 is provided with a CPU 57 or control unit, a perforation photo sensor 58 and a magnetic head 59. CPU 57 controls various elements of the camera 2. The perforation photo sensor 58 detects perforations in the photo film 94. The magnetic head 59 reads data from, writes data to, the magnetic recording layer 96 in the photo film 94. Those elements at the rear board portion 53 are combined to constitute a magnetic head driving circuit. The perforation photo sensor 58 and the magnetic head 59 are fitted respectively in the sensor opening 51a and the head opening 51b in the pressure plate 51, and opposed to the photo film 94. An AF connection terminal 53d is included in the rear board portion 53 and opposed to the rear of the cassette holder chamber 32.

The display panel 21 is secured to a rear surface of the rear board portion 53 of the main flexible circuit board 41. Various switches and contact points appear in the main flexible circuit board 41 about the display panel 21, the switches being associated with the operation panel 22, the contact points constituting the zoom button 16.

Thus, the disposition of the rear board portion 53 facilitates connection of the various elements to the main flexible circuit board 41. Failure in the connection is prevented. The camera 2 can have a reduced size because the total of spaces for wiring can be reduced. Although the numerous lines for connection exist between the display panel 21 and CPU 57, the lines can be located in an economized manner as the lines are disposed both behind and in front of the main flexible circuit board 41. This optimizes the use of the main flexible circuit board 41 in spite of its small size.

The upper board portion 54 of the main flexible circuit board 41 is bent from the rear board portion 53, and secured to the support plate 40 of the cassette holder chamber 32. A motor driver IC 61 is connected to the upper board portion 54, drives and controls the feeder motor 45 and the zoom driving motor 49, and constitutes a power source circuit. The disposition of the motor driver IC 61 at the upper board portion 54 is effective in facilitating wiring by locating the power source circuit near to the battery chamber 23 directly above the take-up chamber 33. Failure in electrical contact can be avoided. Also, the camera 2 can have a reduced size because of reduction in spaces required for wiring.

The front board portion 55 is bent from the upper board portion 54, and secured to the front of the cassette holder chamber 32. A shutter control flexible circuit board 63 is disposed in front of the cassette holder chamber 32 as auxiliary circuit board, and extends from a position in the movable barrel 8. An electronic shutter is incorporated in the movable barrel 8, and is connected with the shutter control flexible circuit board 63. A terminal 63*a* is included in an end portion of the shutter control flexible circuit board 63, and disposed in front of the take-up chamber 33. A shutter connection terminal 55*a* in the front board portion 55 is overlapped on the shutter control flexible circuit board 63 for electrical connection with the terminal 63*a*. A retention plate 65 is secured to the front face of the cassette holder chamber 32, squeezes the shutter connection terminal 55*a* and the terminal 63*a*, and keeps those in contact with each other.

A flash connection terminal 53*a* appears at an edge of the rear board portion 53 of the main flexible circuit board 41. A flash connection flexible circuit board 67 includes a first terminal 67*a* and a second terminal 67*b*. The first terminal 67*a* is connected with the flash connection terminal 53*a*. The second terminal 67*b* is a front end of the flash connection flexible circuit board 67. A flash control printed circuit board 68 is disposed at a front face of the take-up chamber 33, and connected with the second terminal 67*b*. The flash control printed circuit board 68 includes a flash circuit, is controlled by the main flexible circuit board 41 connected therewith by the flash connection flexible circuit board 67, and controls the flash emitter 9 for emission of flash light.

A cassette detecting flexible circuit board 70 has a terminal 70*a*. A detector connection terminal 53*b* of the rear board portion 53 of the main flexible circuit board 41 is connected with the terminal 70*a*. The cassette detecting flexible circuit board 70 is secured to the rear of the cassette holder chamber 32, and detects existence or lack of the photo film cassette 92 in the cassette holder chamber 32. A detection signal is sent through the terminal 70*a* and the detector connection terminal 53*b*, and input to the main flexible circuit board 41.

A PI connection terminal 53*c* is included in a lower portion of the rear board portion 53 of the main flexible circuit board 41. A sensor flexible circuit board 72 as auxiliary circuit board has a belt-shaped connector 72*a* with a terminal, which is connected with the PI connection terminal 53*c*. The sensor flexible circuit board 72 is constituted by a flexible wiring board bent in a Z-shape, and disposed on a lower side of the camera body 3. The belt-shaped connector 72*a* extends to the rear of the camera body 3, and is connected with the PI connection terminal 53*c*.

A zoom sensor 74 of a photo interrupter type is connected with an end of the sensor flexible circuit board 72. A feeder sensor 75 of a photo interrupter type is connected with a middle point of the sensor flexible circuit board 72. The zoom sensor 74 is disposed near to the zoom driving motor 49. A rotary disk 49*a* is secured to an output shaft of the zoom driving motor 49. The zoom sensor 74 detects rotations of the rotary disk 49*a*, and sends detection signals to the main flexible circuit board 41. Similarly, the feeder sensor 75 is associated with an element included in the speed reduction gear train 42 under the camera body 3, detects rotations of the feeder motor 45, and sends detection signals to the main flexible circuit board 41. CPU 57 of the main flexible circuit board 41 calculates a feeding amount of the photo film 94, a zoom position and the like according to detecting signals from the zoom sensor 74 and the feeder sensor 75.

The sensor flexible circuit board 72 has a total length greater than a distance between the feeder sensor 75 and the main flexible circuit board 41. This is for the purpose of absorbing a shift of the main flexible circuit board 41 to prevent disconnection. In FIG. 5A, the pressure plate 51 with the main flexible circuit board 41 secured thereto is removed from the camera body 3 in order to inspect the focal length and the shutter performance in the course of manufacturing. The main flexible circuit board 41 is flexed to raise an end of the pressure plate 51 away from the camera body 3. The sensor flexible circuit board 72 follows the rise of the main flexible circuit board 41, extends by unfolding the Z-shape of the belt-shaped connector 72*a*, and operates to prevent disconnection from the main flexible circuit board 41.

In the above embodiment, the form of the belt-shaped connector 72*a* is obtained by forming the Z-shape directly from raw board material. Alternatively, an original form of the belt-shaped connector 72*a* may be straight. In the camera, the belt-shaped connector 72*a* may be previously folded in the Z-shape at a suitable length in consideration of unfolding at the time of removing the pressure plate 51. Furthermore, the Z-shaped portion may be not included in the sensor flexible circuit board 72 but in the main flexible circuit board 41. Also, the sensor flexible circuit board 72 may be constituted from two boards, the first being provided with the zoom sensor 74 and the feeder sensor 75, the second being connected with the main flexible circuit board 41.

An auto-focus control flexible circuit board 77 is disposed in a position at the top of the main flexible circuit board 41. The auto-focus control flexible circuit board 77 includes an auto-focus (AF) circuit and an auto-exposure (AE) circuit, and is provided with a photometric element, rangefinding projecting element and rangefinding receiving element connected thereto, those elements being disposed on an upper surface of the movable barrel 8. A shutter switch 78 is disposed on an upper face of the auto-focus control flexible circuit board 77, and turned on when pushed by an inner portion of the shutter release button 18.

A connection board portion 80 extends from the auto-focus control flexible circuit board 77, and is disposed behind the cassette holder chamber 32. A terminal 80*a* is included in the connection board portion 80, and has radially disposed segments. In one position behind the cassette holder chamber 32, the terminal 80*a*, the AF connection terminal 53*d* and a terminal of the connection board portion 38 of the information reading flexible circuit board 37 are placed on one another, and connected electrically. A retention plate 82 of approximately a disk shape is secured to the rear of the cassette holder chamber 32 from outside the auto-focus control flexible circuit board 77. This maintains the contacted state between the information reading flexible circuit board 37, the main flexible circuit board 41 and the auto-focus control flexible circuit board 77.

In FIG. 6, the main flexible circuit board 41 has approximately an L-shape in a developed state. At the time of manufacturing the main flexible circuit board 41, two pieces of the main flexible circuit board 41 in combination can be obtained from board material as indicated by the phantom lines. This is effective in increasing yield of production of the main flexible circuit board 41 by reducing waste portions of the main flexible circuit board 41. The cost of the main flexible circuit board 41 can be lower.

In the above embodiment, the camera is for use with the photo film cassette 92 of the IX 240 type. Alternatively, the camera of the invention may be one for use with the photo film cassette 92 of 135 type, an electronic still camera, a video camera, and other electronic instruments.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A camera comprising:
   a camera body for being loaded with photo film;
   a feeder motor, incorporated in said camera body, for feeding said photo film;
   a motor driver IC for driving said feeder motor;
   a control unit for controlling said feeder motor by use of said motor driver IC; and
   a main flexible circuit board, having an upper board portion and a rear board portion, said upper board portion being located on an upper side of said camera body, and provided with said motor driver IC disposed thereon, said rear board portion extending from said upper board portion, being located behind said camera body, and being provided with said control unit disposed thereon.

2. A camera as defined in claim 1, wherein said upper board portion projects from said rear board portion in an L-shape as viewed in a developed state.

3. A camera as defined in claim 2, further comprising a pressure plate, disposed behind said camera body, having a front surface and a rear surface, said front surface supporting said photo film, said rear surface having said rear board portion secured thereto.

4. A camera as defined in claim 3, wherein said photo film includes a magnetic recording layer;
   further comprising a magnetic head, secured to said pressure plate, connected with said rear board portion, controlled by said control unit, for magnetic recording of information to said magnetic recording layer.

5. A camera as defined in claim 4, further comprising:
   an operation member disposed outside said camera body;
   at least one contact point for being turned on/off by said operation member, to input a signal to said control unit, said contact point being provided in said rear board portion;
   a display panel, connected with said rear board portion, for visibly indicating information outside said camera body.

6. A camera as defined in claim 5, further comprising a battery chamber, formed in an upper portion of said camera body, for being loaded with a power source battery for supplying said main flexible circuit board with power.

7. A camera as defined in claim 6, wherein said camera body includes:
   a cassette holder chamber for being loaded with a photo film cassette having said photo film;
   a take-up chamber for taking up said photo film from said photo film cassette;
   an exposure aperture, formed between said cassette holder chamber and said take-up chamber, for creating a frame in said photo film;
   wherein said upper board portion is disposed on an upper side of said cassette holder chamber.

8. A camera as defined in claim 2, further comprising an auxiliary circuit board secured to a front side of said camera body;
   wherein said main flexible circuit board further includes a front board portion extended from said upper board portion toward said front side of said camera body, and connected with said auxiliary circuit board.

9. A camera as defined in claim 8, wherein said auxiliary circuit board is a shutter control flexible circuit board for controlling shutter releasing.

10. A camera as defined in claim 8, further comprising:
    a cassette detecting flexible circuit board, disposed behind said camera body, connected with said main flexible circuit board, for detecting operation of a photo film cassette having said photo film;
    a flash control printed circuit board, disposed on said front side of said camera body, for flash emitting operation;
    a flash connection flexible circuit board, disposed on said upper side of said camera body, for connecting said flash control printed circuit board with said main flexible circuit board; and
    an auto-focus control flexible circuit board, disposed on said upper side of said camera body, connected with said main flexible circuit board, for rangefinding operation.

11. A camera as defined in claim 3, further comprising:
    an auxiliary circuit board secured to said camera body;
    a belt-shaped connector for connecting said auxiliary circuit board to said rear board portion, said belt-shaped connector having a length higher than an interval between said auxiliary circuit board and said rear board portion, for keeping said auxiliary circuit board connected to said rear board portion with looseness when said pressure plate is removed from said camera body.

12. A camera as defined in claim 11, wherein said belt-shaped connector has a folded shape or has a shape being bent back.

13. A camera as defined in claim 12, wherein said belt-shaped connector is disposed at least partially under said camera body.

14. A camera as defined in claim 12, further comprising:
    a taking lens for introducing object light to said photo film;
    a zoom driving motor, controlled by said control unit, for zooming said taking lens;
    a zoom sensor, disposed on said auxiliary circuit board, connected therewith, for detecting a rotational position of said zoom driving motor.

15. A camera as defined in claim 12, further comprising a feeder sensor, disposed on said auxiliary circuit board, connected therewith, for detecting a rotational position of said feeder motor.

16. A camera as defined in claim 12, wherein said belt-shaped connector is an extension continuously extending from said auxiliary circuit board.

17. A camera as defined in claim 12, wherein said belt-shaped connector is previously separate from said main flexible circuit board and said auxiliary circuit board.

18. A camera comprising:
    a camera body for being loaded with photo film;
    an exposure aperture, formed in said camera body, for creating a frame in said photo film;
    a pressure plate, disposed behind said exposure aperture, having a front surface and a rear surface, said front surface supporting said photo film;
    a main flexible circuit board secured to said rear surface of said pressure plate;
    an auxiliary circuit board secured to said camera body; and
    a belt-shaped connector for connecting said auxiliary circuit board to said main flexible circuit board, said belt-shaped connector having a length higher than an interval between said auxiliary circuit board and said main flexible circuit board, for keeping said auxiliary circuit board connected to said main flexible circuit board with looseness when said pressure plate is removed from said camera body.

19. A camera as defined in claim 18, wherein said belt-shaped connector has a folded shape or has a shape being bent back.

20. A camera as defined in claim 19, wherein said belt-shaped connector is disposed at least partially under said camera body.

21. A camera as defined in claim 19, further comprising:
a taking lens for introducing object light to said photo film;
a zoom driving motor for zooming said taking lens;
a zoom sensor, connected with said auxiliary circuit board, for detecting a rotational position of said zoom driving motor.

22. A camera as defined in claim 19, further comprising:
a feeder motor, incorporated in said camera body, for feeding said photo film;
a feeder sensor, connected with said auxiliary circuit board, for detecting a rotational position of said feeder motor.

23. A camera as defined in claim 22, wherein said main flexible circuit board has an upper board portion and a rear board portion, said upper board portion being disposed on an upper side of said camera body, said rear board portion extending from said upper board portion and being secured to said pressure plate;

further comprising:
a motor driver IC, connected with said upper board portion, for driving said feeder motor;
a control unit, connected with said rear board portion, for controlling said feeder motor by use of said motor driver IC.

24. A camera as defined in claim 19, wherein said belt-shaped connector is an extension continuously extending from said auxiliary circuit board.

25. A camera as defined in claim 19, wherein said belt-shaped connector is previously separate from said main flexible circuit board and said auxiliary circuit board.

* * * * *